(12) United States Patent
Chou et al.

(10) Patent No.: US 11,742,265 B2
(45) Date of Patent: Aug. 29, 2023

(54) EXPOSED HEAT-GENERATING DEVICES (71) Applicant: TEXAS INSTRUMENTS INCORPORATED, Dallas, TX (US)

(72) Inventors: Hung-Yu Chou, Taipei (TW); Chi-Chen Chien, New Taipei (TW); Yuh-Harng Chien, New Taipei (TW); Steven Alfred Kummerl, Carrollton, TX (US); Bo-Hsun Pan, Taoyuan (TW); Fu-Hua Yu, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 253 days.

(21) Appl. No.: 16/660,713

(22) Filed: Oct. 22, 2019

(65) Prior Publication Data
US 2021/0118779 A1    Apr. 22, 2021

(51) Int. Cl.
| | |
|---|---|
| *H01L 23/495* | (2006.01) |
| *H01L 21/56* | (2006.01) |
| *H01L 21/48* | (2006.01) |
| *H01L 23/522* | (2006.01) |
| *H01L 23/498* | (2006.01) |
| *H01L 23/31* | (2006.01) |

(52) U.S. Cl.
CPC .... *H01L 23/49568* (2013.01); *H01L 21/4839* (2013.01); *H01L 21/565* (2013.01); *H01L 23/3157* (2013.01); *H01L 23/49548* (2013.01); *H01L 23/49861* (2013.01); *H01L 23/5228* (2013.01)

(58) Field of Classification Search
None
See application file for complete search history.

(56) References Cited

U.S. PATENT DOCUMENTS

| | | | | |
|---|---|---|---|---|
| 5,859,471 | A * | 1/1999 | Kuraishi | H01L 23/49548 257/E23.092 |
| 6,060,768 | A * | 5/2000 | Hayashida | H01L 23/49548 257/735 |
| 6,084,310 | A * | 7/2000 | Mizuno | H01L 23/49562 257/E23.044 |
| 6,198,171 | B1 * | 3/2001 | Huang | H01L 23/4951 257/676 |
| 6,281,568 | B1 * | 8/2001 | Glenn | H01L 23/49548 257/796 |
| 6,818,973 | B1 * | 11/2004 | Foster | H01L 24/49 257/676 |
| 6,953,988 | B2 * | 10/2005 | Seo | H01L 23/49548 257/796 |
| 7,141,867 | B2 * | 11/2006 | Tao | H01L 23/49575 257/676 |
| 7,323,366 | B2 * | 1/2008 | Takahashi | H01L 24/32 438/111 |

(Continued)

*Primary Examiner* — Nishath Yasmeen
(74) *Attorney, Agent, or Firm* — Ronald O. Neerings; Frank D. Cimino (57) ABSTRACT

In some examples, a semiconductor package comprises a lead frame. The lead frame includes a first row of leads; a first pad coupled to the first row of leads; a second row of leads; and a second pad coupled to the second row of leads, the first and second pads separated by a gap. The semiconductor package includes a heat-generating device coupled to the first and second pads and exposed to an exterior of the semiconductor package.

16 Claims, 13 Drawing Sheets

(56) References Cited

U.S. PATENT DOCUMENTS

| | | | |
|---|---|---|---|
| 7,642,643 B2 * | 1/2010 | Hall | H01L 21/565 257/712 |
| 7,808,084 B1 * | 10/2010 | Lee | H01L 23/49503 257/676 |
| 2005/0167791 A1 * | 8/2005 | Youn | H01L 23/49503 257/E23.037 |
| 2017/0287819 A1 * | 10/2017 | Fukase | H01L 23/49575 |

* cited by examiner

EXPOSED HEAT-GENERATING DEVICES

BACKGROUND

During manufacture, semiconductor chips (also commonly referred to as "dies") are typically mounted on die pads of lead frames and are wire-bonded, clipped, or otherwise coupled to leads of the lead frame. Other devices may similarly be mounted on a lead frame pad. The assembly is later covered in a mold compound, such as epoxy, to protect the assembly from potentially damaging heat, physical trauma, moisture, and other deleterious factors. The finished assembly is called a semiconductor package or, more simply, a package.

SUMMARY

In some examples, a semiconductor package comprises a lead frame. The lead frame includes a first row of leads; a first pad coupled to the first row of leads; a second row of leads; and a second pad coupled to the second row of leads, the first and second pads separated by a gap. The semiconductor package includes a heat-generating device coupled to the first and second pads and exposed to an exterior of the semiconductor package.

In some examples, a method comprises fabricating a lead frame including first and second leads, a first pad coupled to the first lead and a second pad coupled to the second lead, the first and second pads separated by a gap. The method also comprises coupling a heat-generating device to the first and second pads. The method further comprises applying a mold compound to the lead frame and the heat-generating device to form a housing, the heat-generating device exposed to an exterior of the housing.

BRIEF DESCRIPTION OF THE DRAWINGS

For a detailed description of various examples, reference will now be made to the accompanying drawings in which.

DETAILED DESCRIPTION

Packages suffer from various design flaws that can result in suboptimal performance. For example, devices within the package, such as shunt resistors, generate heat. To protect the integrity of the package and its contents, this heat should be dissipated out of the package. If the heat is not adequately removed, various parts of the package may be irreparably damaged. Current techniques for removing heat from shunt resistors are inefficient and inadequate. In addition, when devices such as dies and other devices are coupled to lead frames, viscous materials—particularly solder—are often used to establish the connection. The solder, however, can undesirably flow into certain areas of the package or lead frame, resulting in functional or cosmetic defects.

This disclosure presents semiconductor packages that resolve the aforementioned problems. In examples, a package includes a lead frame with multiple leads and pads coupled to the leads. For example, a first pad may couple to a first set of leads, a second pad may couple to a second pad of leads, and a gap may separate the first and second pads. In addition, the package comprises a shunt resistor that bridges the gap between the pads. The shunt resistor is exposed to an exterior of the package. For example, a surface of the shunt resistor may be flush with an exterior surface of the package, such as the top surface or the bottom surface of the package. By exposing the shunt resistor in this manner, heat may be efficiently dissipated from the package. In some examples, the shunt resistor is coupled to a heat conductor, such as a heat sink or a component of a printed circuit board (PCB), to facilitate heat dissipation. Although this disclosure is presented in the context of an exposed shunt resistor, the manufacturing techniques and package configurations described herein may be extended to other package components as well.

Figure 1A:
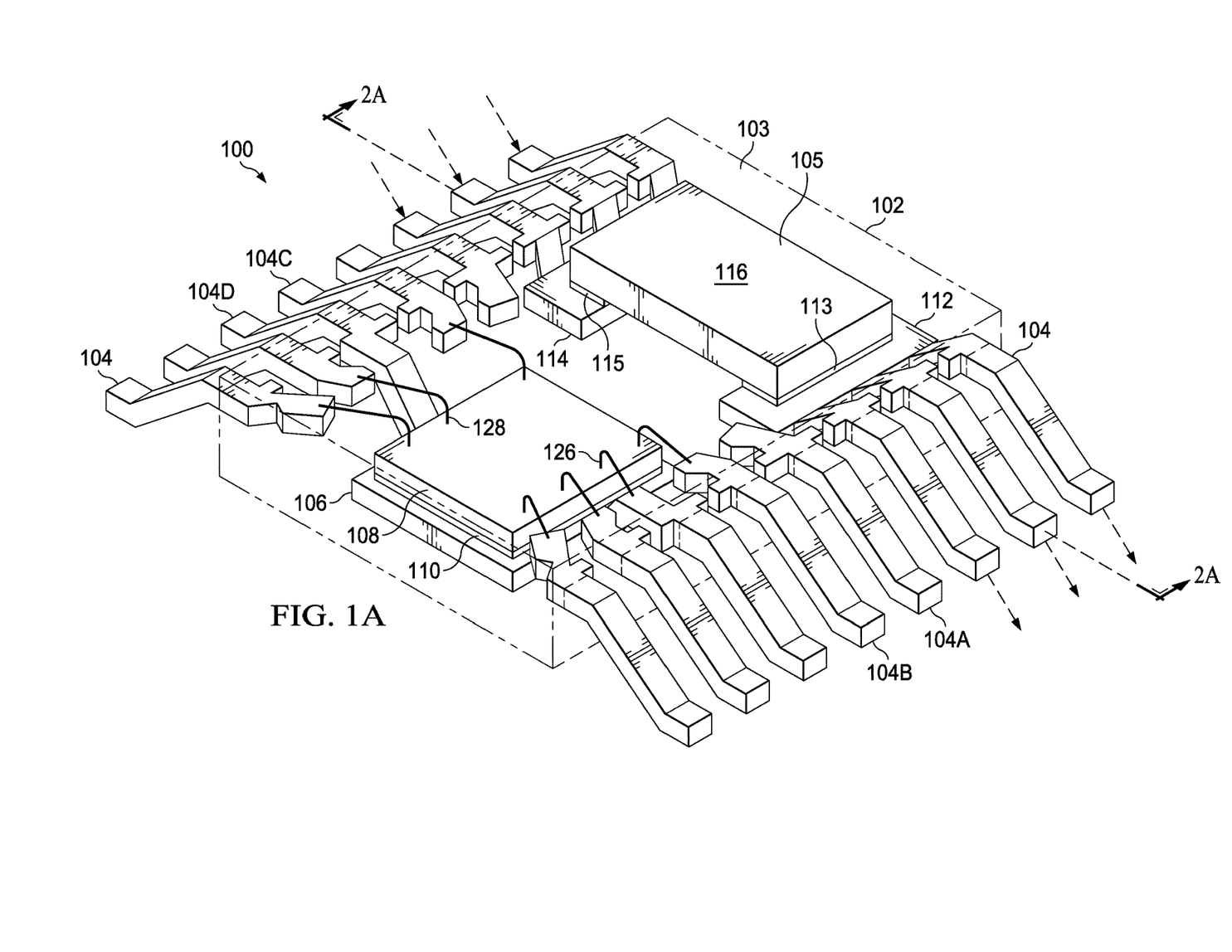
FIG. 1A depicts a perspective view of the contents of a package having a shunt resistor exposed to a top surface of the package, in accordance with various examples.

FIG. 1A depicts a perspective view of the contents of a package 100 having a shunt resistor exposed to a top surface of the package, in accordance with various examples. Specifically, the package 100 comprises a mold compound 102 and leads 104 (e.g., gullwing leads) extending from within the mold compound 102. The mold compound 102 covers various components, including a die pad 106; a die 108 (e.g., an integrated circuit formed on and in a semiconductor wafer) coupled to the die pad 106 using an adhesive 110 (e.g., solder); a pad 112; a pad 114; and a heat-generating device 116 (e.g., a shunt resistor) coupled to the pads 112, 114 using adhesives 113, 115 (e.g., solder, silver sintered interconnect material, respectively). The heat-generating device 116 bridges a gap between the pads 112, 114, as shown. In an example, the pad 112 has a substantially uniform thickness (e.g., 200 microns; ranging between 100 and 400 microns). In an example, the pad 114 has a substantially uniform thickness (e.g., 200 microns; ranging between 100 and 400 microns). The pad 112 couples to leads 104 in a first row of leads that includes the leads 104A, 104B. The pad 114 couples to leads 104 in a second row of leads that includes the leads 104C, 104D. The first and second rows of leads are positioned opposite each other, as shown. The leads 104, the pads 112, 114, and the die pad 106 are collectively referred to herein as forming a leadframe. Although the term "leadframe" is sometimes understood to refer to the monolithic structure to which leads, pads, die pads, etc. are coupled after manufacture and pre-trimming, the term "leadframe" is used herein to refer to the leads 104, the pads 112, 114, and the die pad 106 collectively, regardless of whether these components are coupled to each other or not.

As shown, the heat-generating device 116 has a top surface 105, and the mold compound 102 has a top surface 103. In examples, the top surface 105 is exposed to the top surface 103. This may mean, for instance, that the top surfaces 105, 103 are flush with each other and that the top surface 105 is exposed to an exterior environment of the package 100, i.e., the mold compound 102 does not cover the top surface 105. In some examples, the top surface 105 may be exposed to the top surface 103 in the sense that the top surface 105 is not covered by the mold compound 102, but the top surface 105 is not flush with the top surface 103. For example, the top surface 105 may be higher than or lower than the top surface 103. By any such exposure, heat generated by the heat-generating device 116 is expelled from within the package 100, and the deleterious consequences of excessive heat within the package 100 as described above are mitigated. In some examples, the pads 112, 114 are not exposed to any exterior surface of the package 100, meaning that in such examples, they are fully covered by the mold compound 102. In general, the term "exposed to" as used herein refers to a surface that has unobstructed access to an exterior of a semiconductor package due to a lack of mold compound covering the surface.

The heat-generating device 116 may be any suitable component. For example, the heat-generating device 116 may comprise a shunt resistor that is used, e.g., to measure voltage across or current through the shunt resistor (miscellaneous wires and couplings used to perform such measurements are omitted for the sake of clarity in the drawings). Alternatively, the heat-generating device 116 may comprise any of a variety of other circuit components.

The die 108 may be designed and manufactured to perform any of a variety of tasks suitable for the operation of the package 100. The die 108 may couple to appropriate leads 104 via, e.g., wires 126, 128. Other connections, such as clips, also may be used.

Figure 1B:
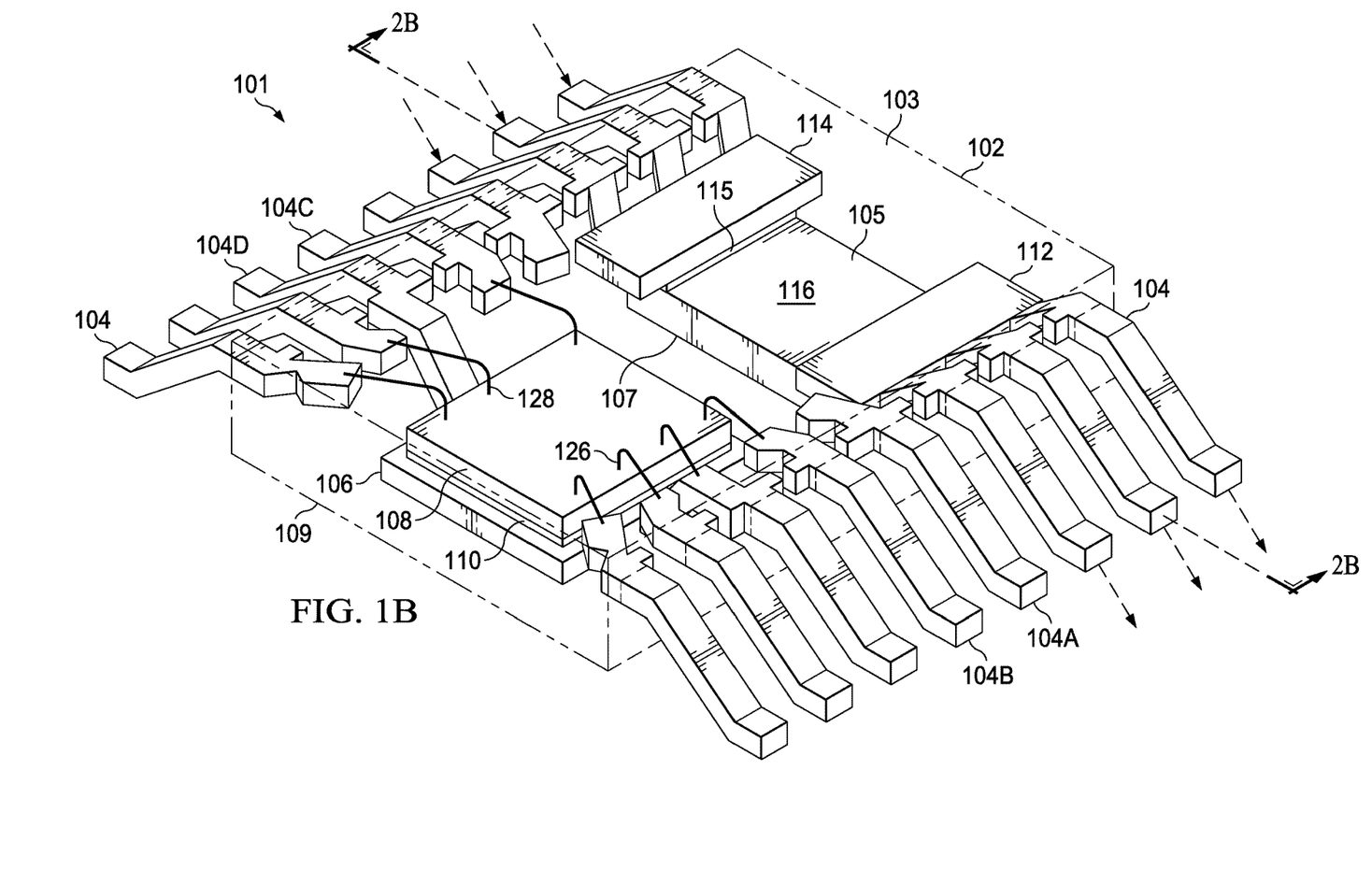
FIG. 1B depicts a perspective view of the contents of a package having a shunt resistor exposed to a bottom surface of the package, in accordance with various examples.

FIG. 1B depicts a perspective view of the contents of a package 101 having a shunt resistor exposed to a bottom surface of the package, in accordance with various examples. The package 101 depicted in FIG. 1B is identical to the package 100 depicted in FIG. 1A with like numerals referring to like components, except that the heat-generating device 116 is coupled to bottom surfaces of the pads 112, 114, such that a bottom surface 107 of the heat-generating device 116 is exposed to a bottom surface 109 of the package 101. The heat-generating device 116 couples to the bottom surfaces of the pads 112, 114 using adhesives, such as adhesive 115. Similar to the package 100, which expels heat generated by or provided to the heat-generating device 116 via the top surface 103 of the package 100, the package 101 expels heat generated by or provided to the heat-generating device 116 via the bottom surface 109 of the package 101. As described below, the heat-generating device 116 may also be coupled to suitable heat dissipation components, such as a heat sink or a PCB metal trace, to enhance heat dissipation.

Figure 2A:
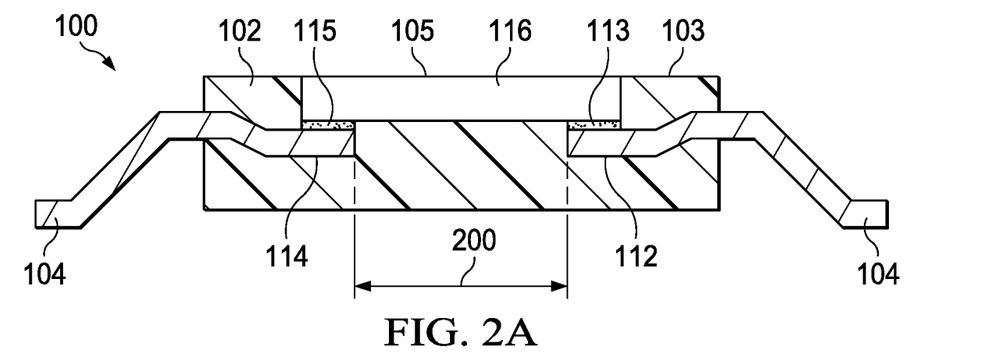
FIG. 2A depicts a cross-sectional view of the contents of a package having a shunt resistor exposed to a top surface of the package, in accordance with various examples.

FIG. 2A depicts a cross-sectional view of the contents of the package 100, in accordance with various examples. As shown, the top surface 105 of the heat-generating device 116 is exposed to the top surface 103 of the mold compound 102 (i.e., of the package 100). The bottom surface 107 of the heat-generating device 116 couples to the pads 112, 114 using adhesives 113, 115. The heat-generating device 116 bridges a gap 200 between the pads 112, 114. As depicted, in some examples, the pads 112, 114 are uniform or substantially uniform in thickness. In some examples, the thickness of the heat-generating device 116 is approximately 0.3 mm. In some examples, the thickness of the package 100 is approximately 0.8 mm. The structure (e.g., shape, angles, lengths) of the leads 104 may be adjusted as desired so that the leads 104 make contact with the heat-generating device 116 via the adhesives 113, 115 and so that, when mounted on a PCB, they make adequate electrical contact with the PCB. In operation, heat generated by or received by the heat-generating device 116 may be expelled via the top surface 105 at the top of the package 100.

Figure 2B:
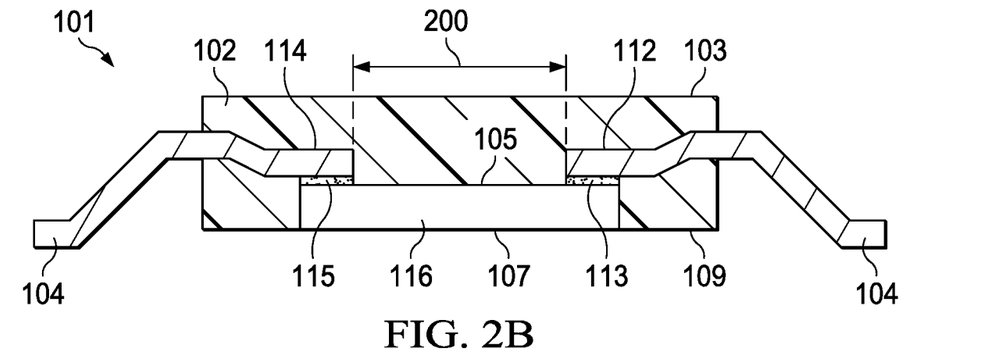
FIG. 2B depicts a cross-sectional view of the contents of a package having a shunt resistor exposed to a bottom surface of the package, in accordance with various examples.

FIG. 2B depicts a cross-sectional view of the contents of the package 101, in accordance with various examples. In FIG. 2B, the bottom surface 107 of the heat-generating device 116 is exposed to the bottom surface 109 of the mold compound 102 (i.e., of the package 101). The heat-generating device 116 couples to the bottom surfaces of the leads 112, 114 using adhesives 113, 115. As explained above, the term "exposed to" in this context means that the bottom surface 107 is not covered by the mold compound 102, regardless of whether the bottom surface 107 is flush or not flush with the bottom surface 105. The dimensions provided above with respect to the package 100 of FIG. 2A also apply to the package 101 of FIG. 2B. In operation, heat generated by or received by the heat-generating device 116 is expelled via the bottom surface 107.

Figure 3A:
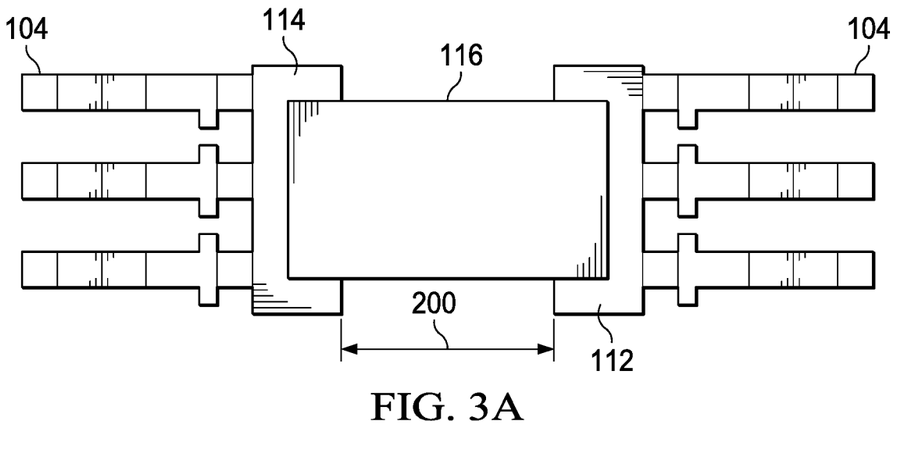
FIG. 3A depicts a top-down view of the contents of a package having a shunt resistor exposed to a top surface of the package, in accordance with various examples.

FIG. 3A depicts a top-down view of a portion of the contents of the package 100 (FIGS. 1A, 2A), in accordance with various examples. Specifically, FIG. 3A depicts the heat-generating device 116, the pads 112, 114, and the leads 104 of the package 100. In the example of FIG. 3A, the front-to-rear length of the heat-generating device 116 is less than the front-to-rear lengths of the pads 112, 114. In another example, the front-to-rear length of the heat-generating device 116 is approximately the same as the front-to-rear lengths of the pads 112, 114. In an example, the front-to-rear lengths of the pads 112, 114 are approximately 2000 to 4000 microns, and the front-to-rear length of the heat-generating device 116 is approximately 1000 to 2000 microns. In some examples, these dimensions are reversed such that the heat-generating device 116 has a larger dimension than the pads 112, 114. Other dimensions may be used. The gap 200 separates the pads 112, 114.

Figure 3B:
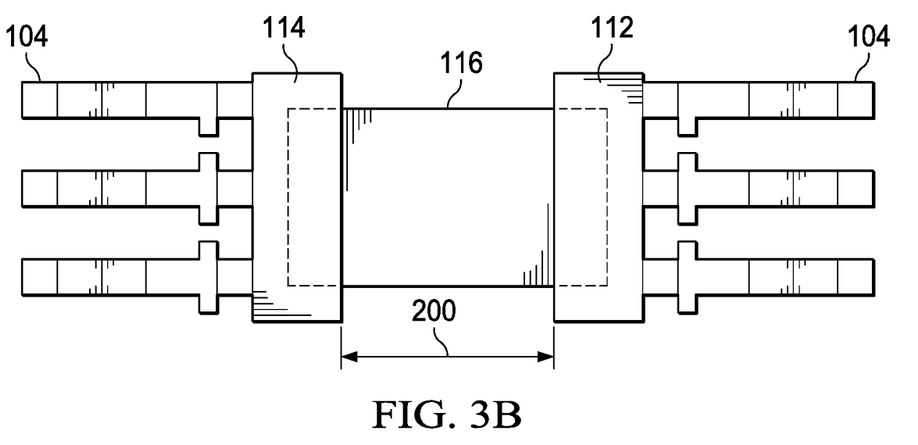
FIG. 3B depicts a top-down view of the contents of a package having a shunt resistor exposed to a bottom surface of the package, in accordance with various examples.

FIG. 3B depicts a top-down view of a portion of the contents of the package 101 (FIGS. 1B, 2B), in accordance with various examples. The example dimensions provided with respect to the package 100 in relation to FIG. 3A also apply to the package 101.

Figure 4A:
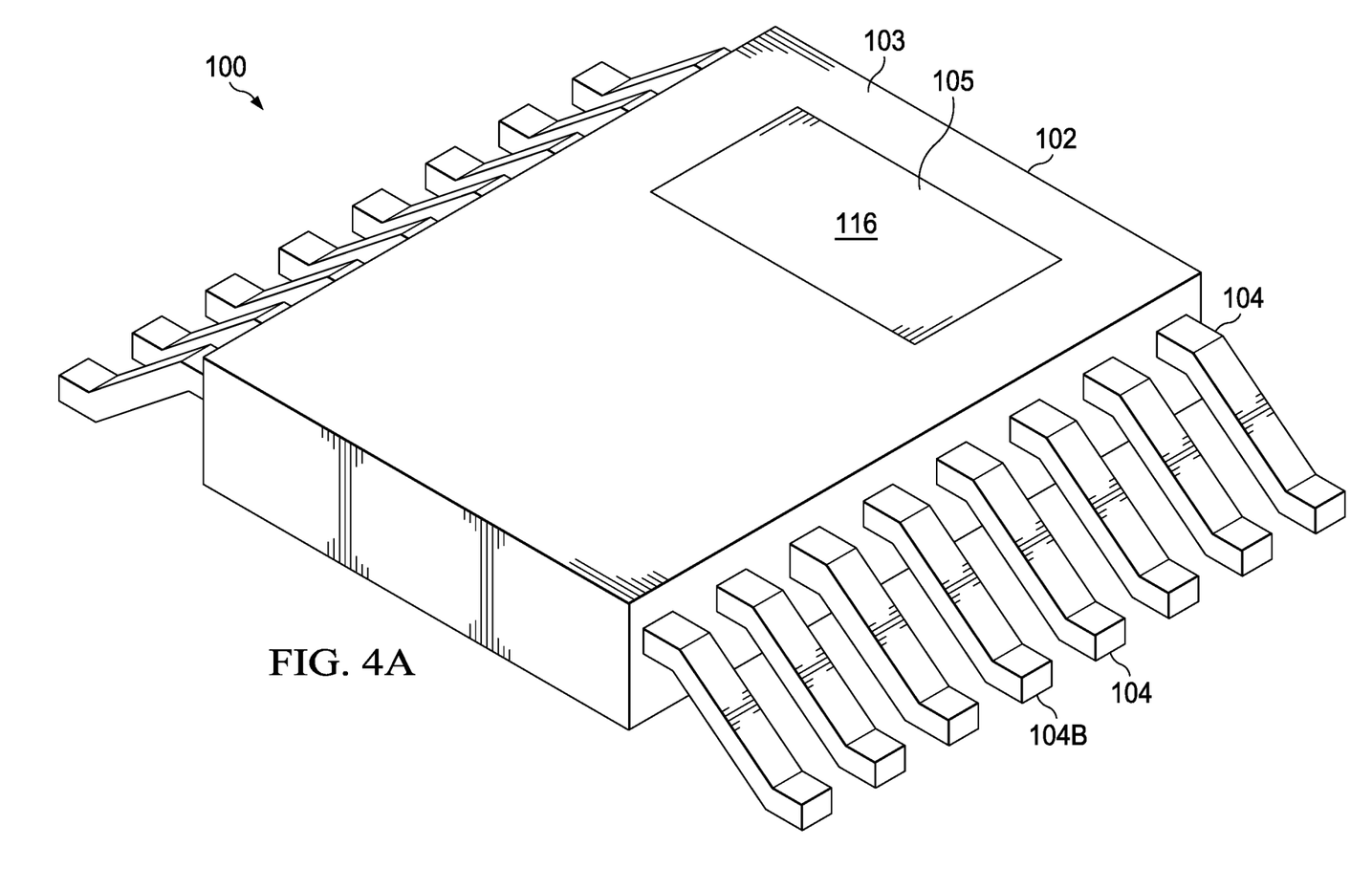
FIG. 4A depicts a perspective view of the outer features of a package having a shunt resistor exposed to a top surface of the package, in accordance with various examples.

FIG. 4A depicts a perspective view of the outer features of the package 100 (FIGS. 1A, 2A, 3A), in accordance with various examples. Specifically, FIG. 4A shows a top surface 103 of the package 100, the mold compound 102, the leads 104, and the top surface 105 of the heat-generating device 116. As shown, the top surface 105 is exposed to an exterior of the package 100. Specifically, the top surface 105 is flush with the top surface 103 of the mold compound 102 (i.e., of the package 100). Heat is expelled from the heat-generating device 116 to an exterior of the package 100 via the top surface 105.

Figure 4B:
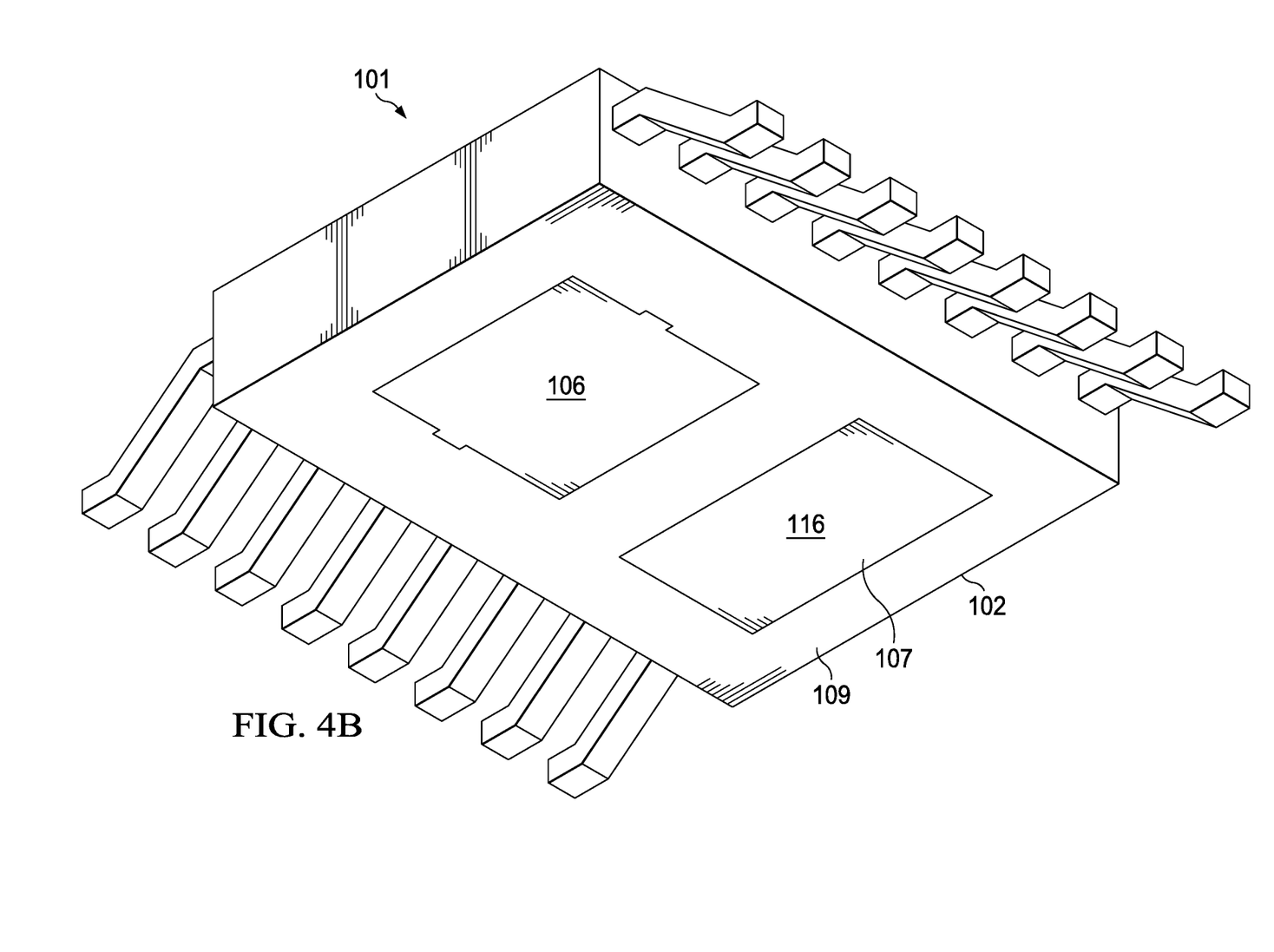
FIG. 4B depicts a perspective view of the outer features of a package having a shunt resistor exposed to a bottom surface of the package, in accordance with various examples.

FIG. 4B depicts a perspective view of the outer features of the package 101 (FIGS. 1B, 2B, 3B), in accordance with various examples. Specifically, FIG. 4B shows a bottom surface 109 of the mold compound 102 (i.e., of the package 101), the leads 104, the die pad 106, and the bottom surface 107 of the heat-generating device 116. As shown, the bottom surface 107 is exposed to an exterior of the package 101. Specifically, the bottom surface 107 is flush with the bottom surface 109 of the mold compound 102 (i.e., of the package 101). Heat is expelled from the heat-generating device 116 to an exterior of the package 101 via the bottom surface 107.

Figure 5A:
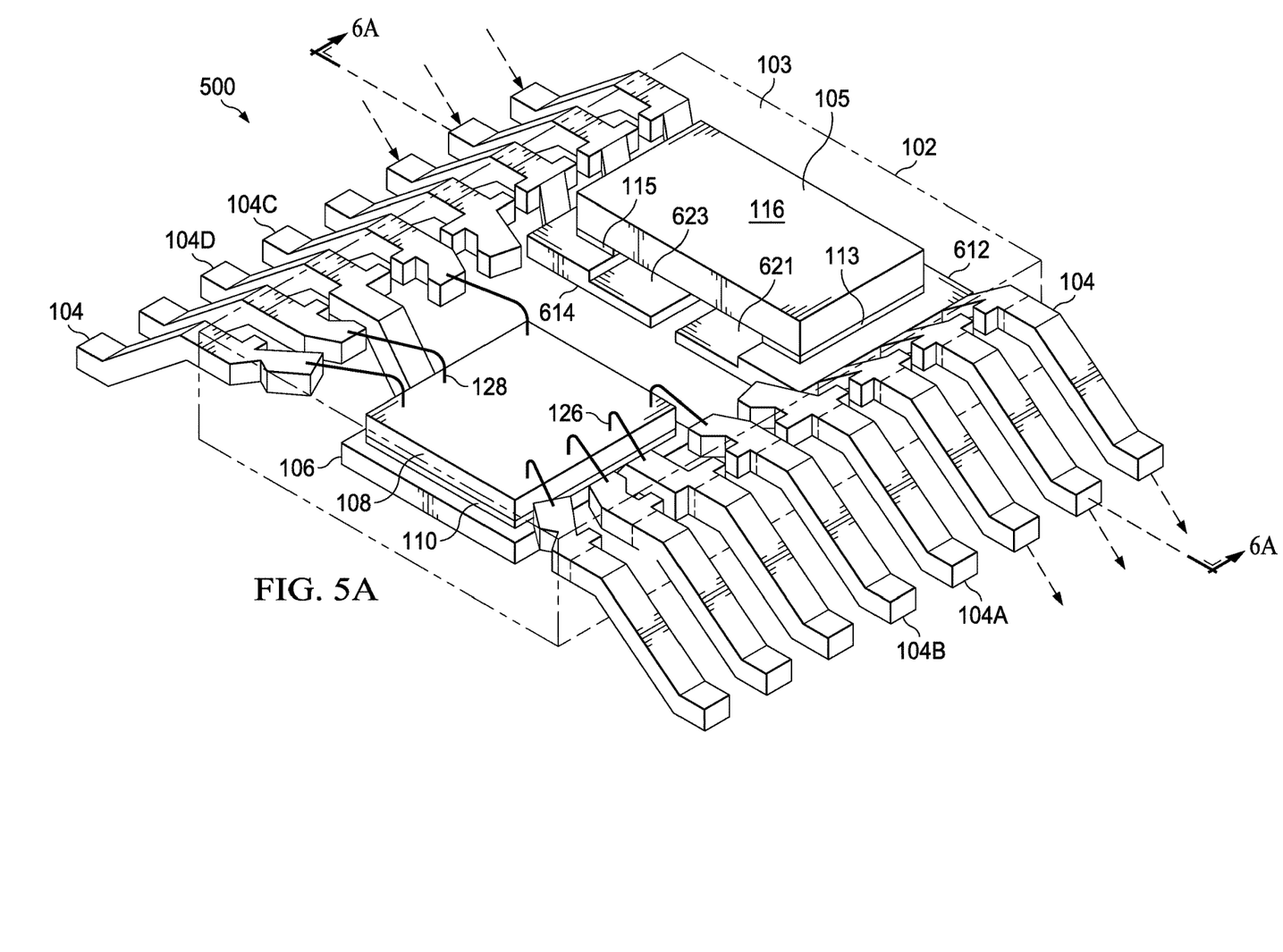
FIG. 5A depicts a perspective view of the contents of a package having a shunt resistor exposed to a top surface of the package, where the shunt resistor is coupled to stepped pads, in accordance with various examples.

FIG. 5A depicts a perspective view of the contents of the package 500 having a heat-generating device 116 with a top surface 105 exposed to a top surface 103 of the package, where the heat-generating device 116 is coupled to stepped pads 612, 614, in accordance with various examples. The package 500 is virtually identical to the package 100 (FIG. 1A, 2A, 3A, 4A, with like numerals referring to like components), except that the stepped pads 612, 614 of the package 500 differ from the uniform-thickness pads 112, 114 of the package 100. Specifically, while the pads 112, 114 are of substantially uniform thickness, each of the pads 612, 614 has a recessed portion and a non-recessed portion. The pad 612 has a recessed portion 621, and the remainder of the pad 612 is a non-recessed portion. In some examples, the recessed portion 621 is approximately half the thickness of the non-recessed portion of the pad 612. The pad 614 has a recessed portion 623, and the remainder of the pad 614 is a non-recessed portion. In some examples, the recessed portion 623 is approximately half the thickness of the non-recessed portion of the pad 614. The heat-generating device 116 couples directly to the non-recessed portions of the pads 612, 614, but the heat-generating device 116 does not couple directly to or otherwise contact the recessed portions 621, 623 of the pads 612, 614.

The recessed areas 621, 623 present multiple advantages. As just one example, when the heat-generating device 116 is coupled to the pads 612, 614 using, e.g., solder, the solder can flow away from the points of contact between the heat-generating device 116 and the pads 612, 614. The recessed portions 621, 623, however, preclude solder flow from reaching the gap between the recessed portions 621, 623, since as a practical matter the solder flow is likely to terminate prior to reaching the gap between the recessed portions 621, 623. In this way, cosmetic defects are avoided.

Figure 5B:
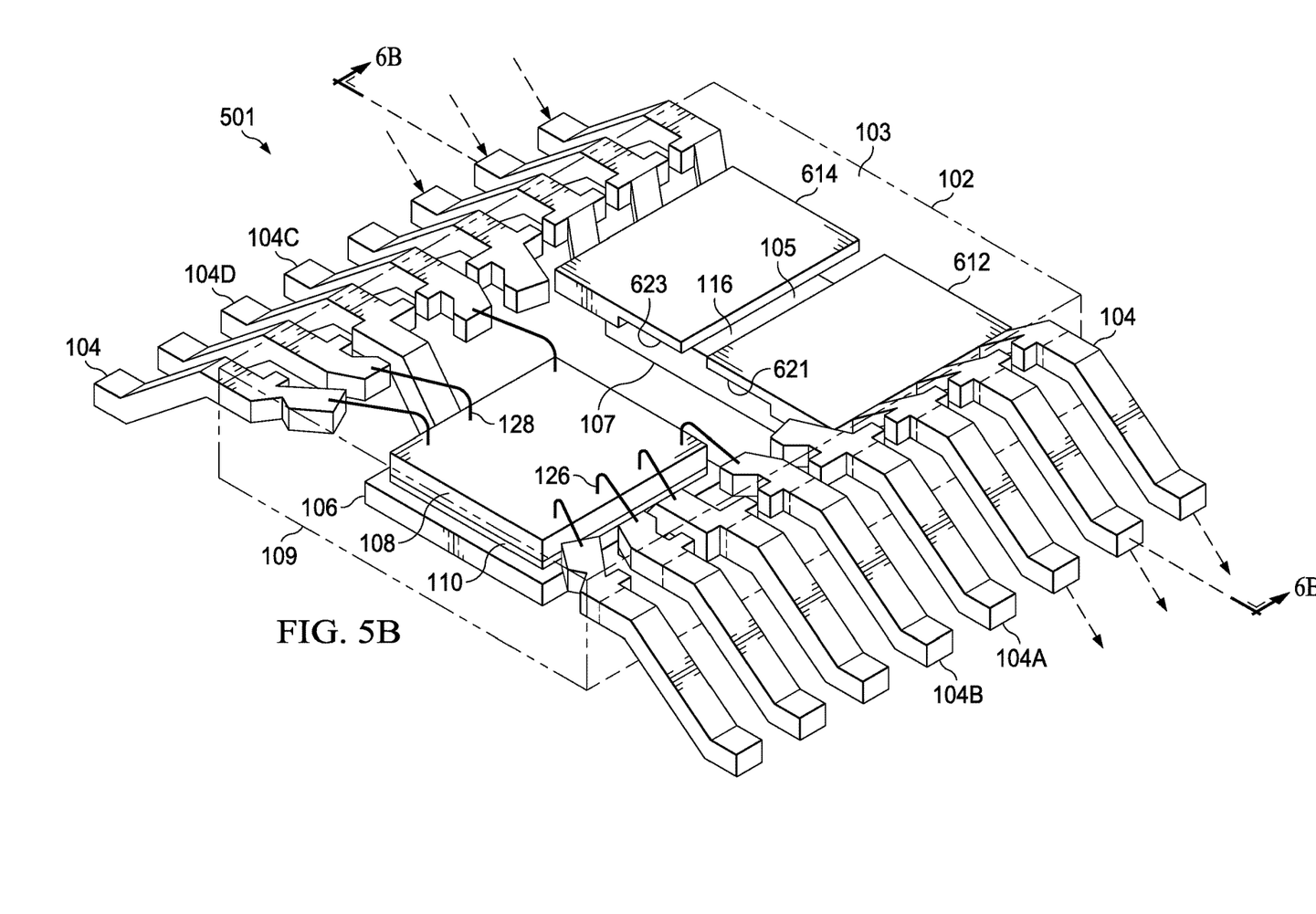
FIG. 5B depicts a perspective view of the contents of a package having a shunt resistor exposed to a bottom surface of the package, where the shunt resistor is coupled to stepped pads, in accordance with various examples.

FIG. 5B depicts a perspective view of the contents of the package 501 having a heat-generating device 116 exposed to a bottom surface 109 of the package 501, where the heat-generating device 116 is coupled to stepped pads 612, 614, in accordance with various examples. Specifically, the package 501 as depicted in FIG. 5B is virtually identical to the package 500 depicted in FIG. 5A, except that the heat-generating device 116 is exposed to the bottom surface 109 instead of the top surface 103 and the stepped pads 612, 614 are oriented so that the recessed portions 621, 623 face the heat-generating device 116 (downward). The package 501 has the same advantages as the package 500 with respect to the stepped pads 612, 614, as described above.

Figure 6A:
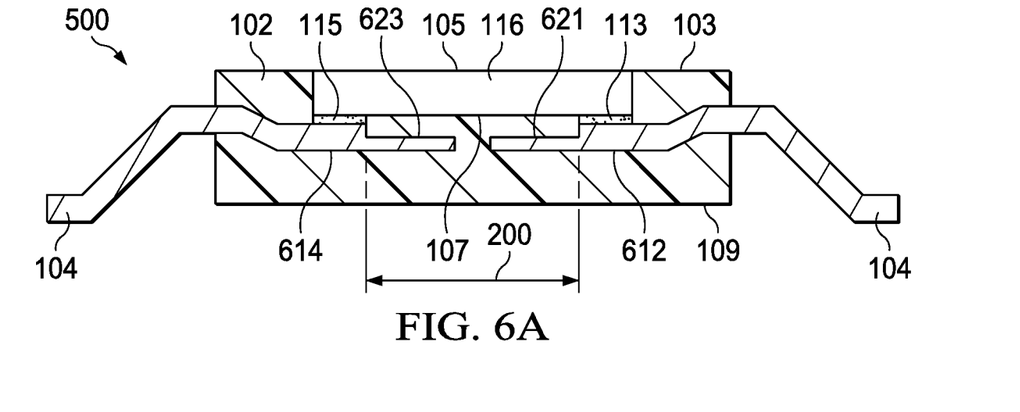
FIG. 6A depicts a cross-sectional view of the contents of a package having a shunt resistor exposed to a top surface of the package, the shunt resistor coupled to stepped pads, in accordance with various examples.

FIG. 6A depicts a cross-sectional view of the contents of the package 500 (FIG. 5A), in accordance with various examples. As shown, in some examples, the pads 612, 614 are stepped, with recessed portions 621, 623. In some examples, the recessed portions 621, 623 are approximately half as thick as the non-recessed portions of the pads 612, 614. In some examples, the thickness of the heat-generating device 116 is approximately 0.3 mm. In some examples, the thickness of the package 500 is approximately 0.8 mm. The structure (e.g., shape, angles, lengths) of the leads 400 may be adjusted as desired so that the leads 400 make contact with the heat-generating device 116 via the adhesives 113, 115 and so that, when mounted on a PCB, they make adequate electrical contact with the PCB. In operation, heat generated by or received by the heat-generating device 116 may be expelled via the top surface 105 at the top surface 103 of the package 500.

Figure 6B:
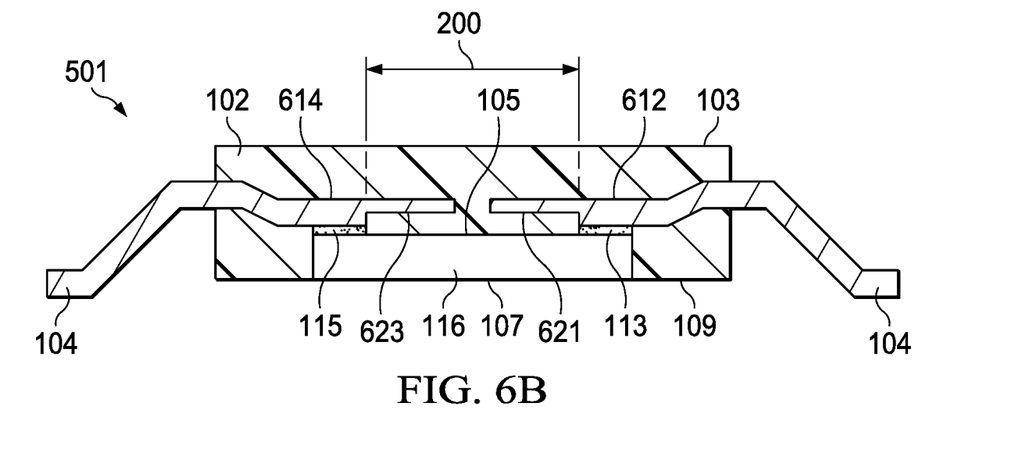
FIG. 6B depicts a cross-sectional view of the contents of a package having a shunt resistor exposed to a bottom surface of the package, the shunt resistor coupled to stepped pads, in accordance with various examples.

FIG. 6B depicts a cross-sectional view of the contents of the package 501 (FIG. 5B), in accordance with various examples. The package 501 includes stepped pads 612, 614, as described above. The bottom surface 107 of the heat-generating device 116 is exposed to the bottom surface 109 of the package 501. The dimensions provided above with respect to the package 500 of FIG. 6A also apply to the package 501 of FIG. 6B.

Figure 7A:
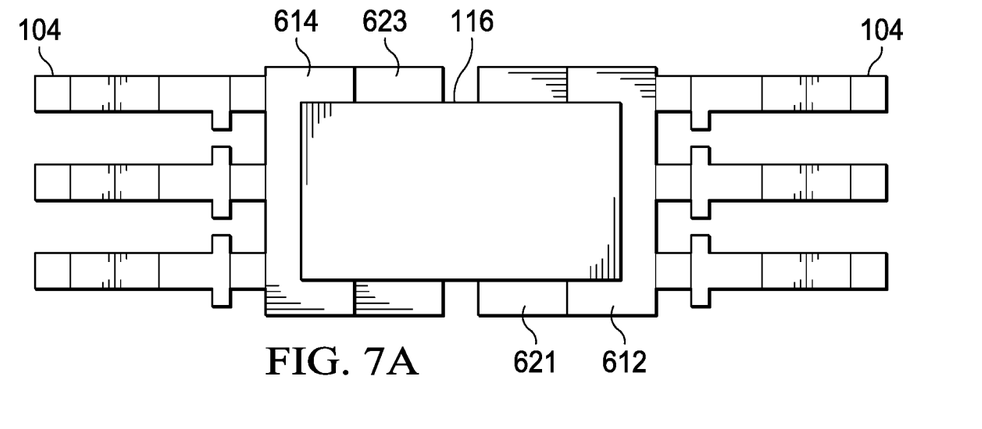
FIG. 7A depicts a top-down view of the contents of a package having a shunt resistor exposed to a top surface of the package, where the shunt resistor is coupled to stepped pads, in accordance with various examples.

FIG. 7A depicts a top-down view of a portion of the contents of a package having a heat-generating device exposed to a top surface of the package, where the heat-generating device is coupled to stepped pads, in accordance with various examples. Specifically, FIG. 7A depicts the heat-generating device 116, the stepped pads 612, 614, and the leads 104 of the package 500 (FIGS. 5A, 6A). In the example of FIG. 7A, the front-to-rear length of the heat-generating device 116 is less than the front-to-rear lengths of the pads 612, 614. In another example, the front-to-rear length of the heat-generating device 116 is approximately the same as the front-to-rear lengths of the stepped pads 612, 614. In an example, the front-to-rear lengths of the pads 612, 614 are approximately 2000 to 4000 microns, and the front-to-rear length of the heat-generating device 116 is approximately 1000 to 2000 microns. In some examples, these dimensions are reversed such that the heat-generating device 116 has a larger dimension than the stepped pads 612, 614. Other dimensions also may be used.

Figure 7B:
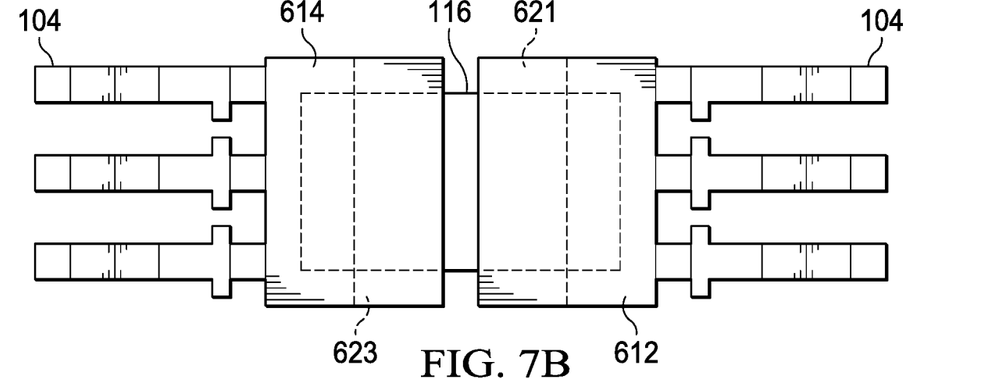
FIG. 7B depicts a top-down view of the contents of a package having a shunt resistor exposed to a bottom surface of the package, where the shunt resistor is coupled to stepped pads, in accordance with various examples.

FIG. 7B depicts a top-down view of a portion of the contents of the package 501 (FIGS. 5B, 6B), in accordance with various examples. The example dimensions provided with respect to the package 500 in relation to FIG. 7A also may apply to the package 501.

Figure 8:
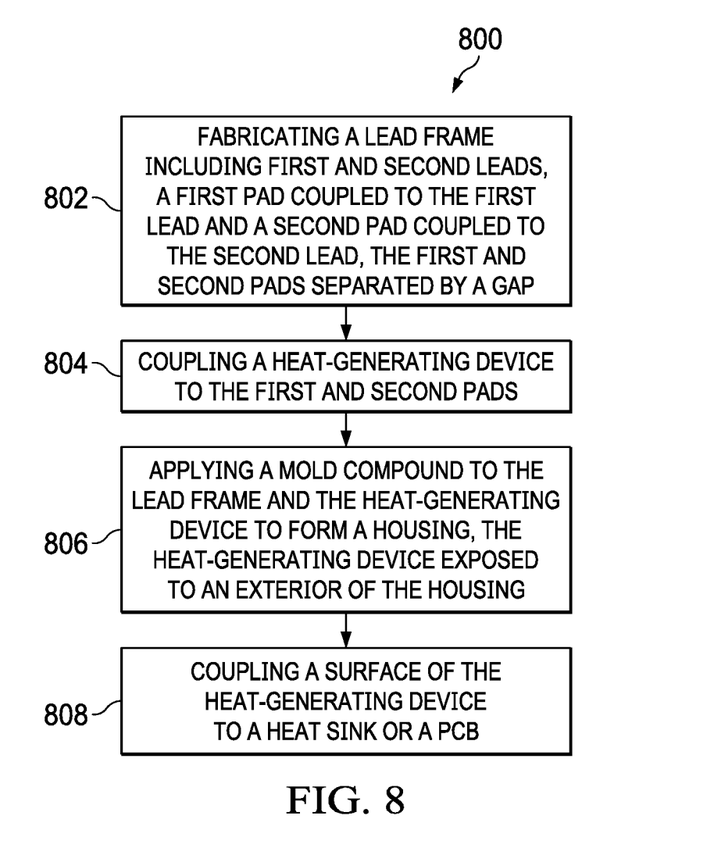
FIG. 8 depicts a flow diagram of a method for manufacturing a semiconductor package having a shunt resistor exposed to a surface of the package, in accordance with various examples.
Figure 9A:
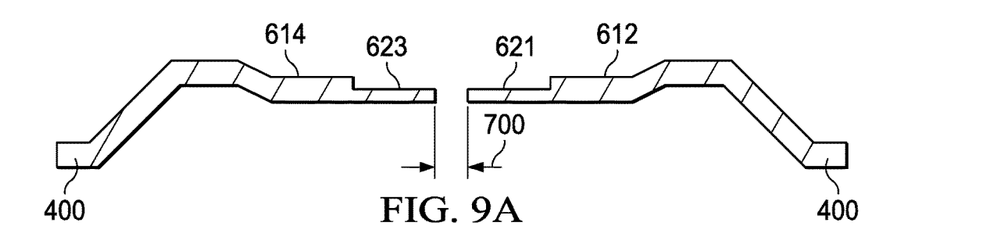
FIG. 9A-9D depict a process flow for manufacturing a semiconductor package having a shunt resistor exposed to a top surface of the package, in accordance with various examples.
Figure 9B:
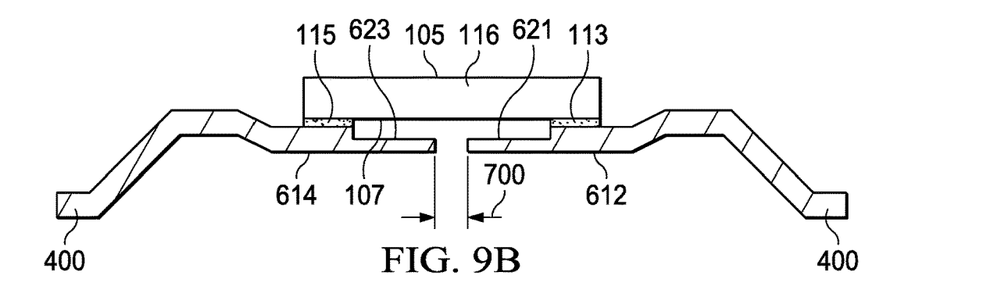
Figure 9C:
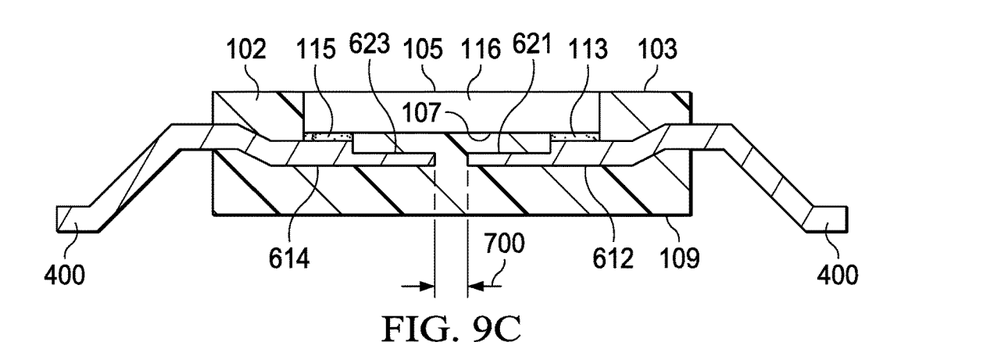
Figure 9D:
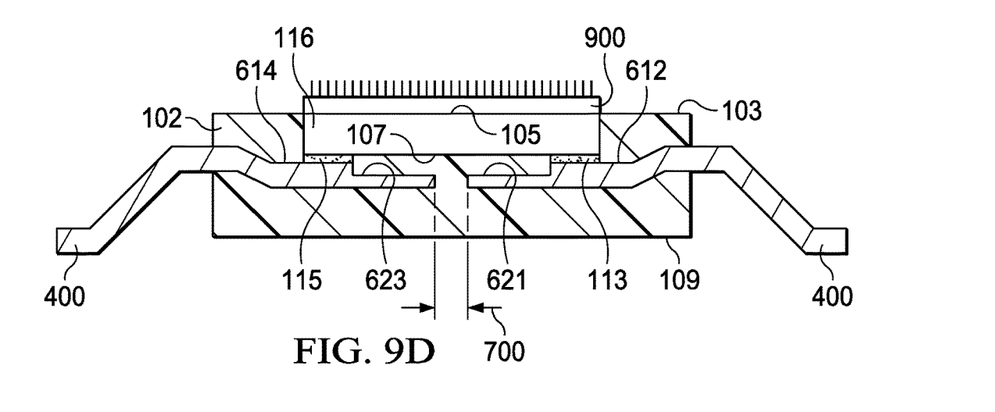
Figure 10A:
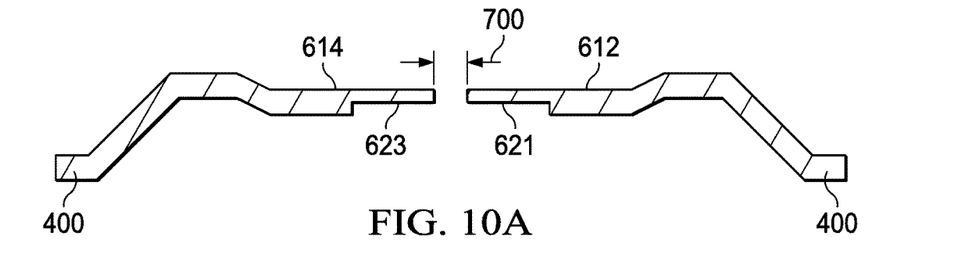
FIG. 10A-10D depict a process flow for manufacturing a semiconductor package having a shunt resistor exposed to a bottom surface of the package, in accordance with various examples.
Figure 10B:
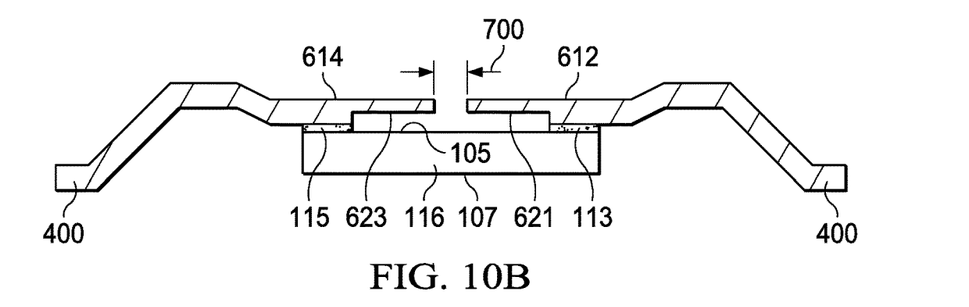

FIG. 8 depicts a flow diagram of a method 800 for manufacturing a semiconductor package having a heat-generating device exposed to a surface of the package, in accordance with various examples. The method 800 is described in tandem with FIGS. 9A-9D and 10A-10D, which depict manufacturing process flows for semiconductor packages having heat-generating devices exposed to top and bottom surfaces of the packages, respectively. The method 800 begins by fabricating a lead frame including first and second leads, with a first pad coupled to the first lead and a second pad coupled to the second lead (802). The first and second pads are separated by a gap. FIG. 9A depicts leads 400 coupled to pads 612, 614 having recessed portions 621, 623 and separated by a gap 700. In some examples, the pads may be of uniform thickness, such as the pads 112, 114 described above. FIG. 10A depicts a similar configuration but with the leads 400 positioned upside down relative to their orientation in FIG. 9A. The method 800 then comprises coupling a heat-generating device, such as a shunt resistor, to the first and second pads (804). FIG. 9B depicts a heat-generating device 116 coupled to the top surfaces of the first and second pads 612, 614, and FIG. 10B depicts a heat-generating device 116 coupled to the bottom surfaces of the first and second pads 612, 614.

Figure 10C:
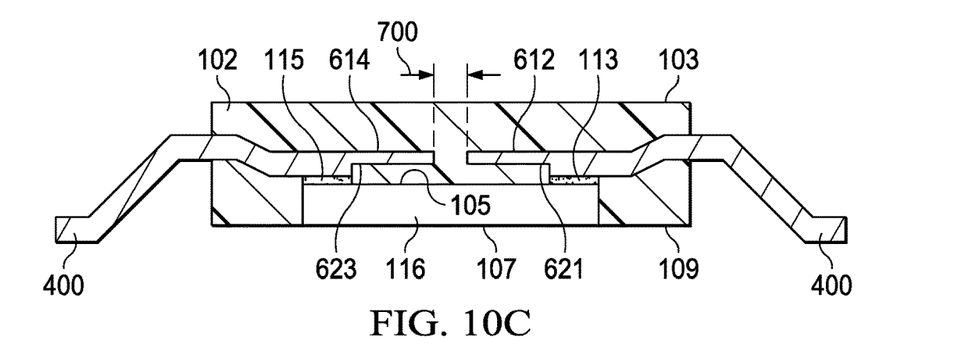
Figure 10D:
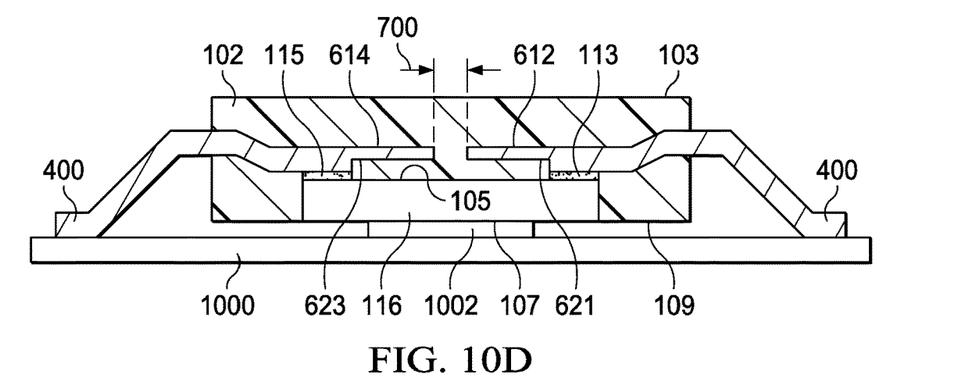

The method 800 next includes applying a mold compound to the lead frame and the heat-generating device to form a housing, with the heat-generating device exposed to an exterior of the housing (806). FIG. 9C depicts a fully-formed semiconductor package similar to that depicted in FIG. 2A, and FIG. 10C depicts a fully-formed semiconductor package similar to that depicted in FIG. 2B. The method 800 further comprises coupling a surface of the heat-generating device to a heat sink or a PCB (808). For example, the semiconductor package of FIG. 9C has a heat-generating device exposed to a top surface of the package, and so a heat sink 900 may be coupled to the exposed portion of the heat-generating device, as FIG. 9D depicts. Similarly, the semiconductor package of FIG. 10C has a heat-generating device exposed to a bottom surface of the package, and so a metallic trace 1002 of a PCB 1000 may be coupled to the exposed portion of the heat-generating device as the package is mounted to the PCB 1000, as FIG. 10D depicts.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications. Unless otherwise stated, "about," "approximately," or "substantially" preceding a value means +/−10 percent of the stated value.

What is claimed is:

1. A semiconductor package, comprising: a lead frame including: a first row of leads; a first pad coupled to the first row of leads; a second row of leads; and a second pad coupled to the second row of leads, the first and second pads separated by a gap; and
a heat-generating device coupled to the first and second pads and exposed to a top surface of the semiconductor package.

2. The semiconductor package of claim 1, wherein each of the first and second pads includes a recessed portion and a non-recessed portion.

3. The semiconductor package of claim 1, wherein the first and second pads are not exposed to the exterior of the semiconductor package.

4. The semiconductor package of claim 1, wherein a surface of the heat-generating device is flush with the top surface of the semiconductor package.

5. The semiconductor package of claim 1, wherein the heat- generating device comprises a shunt resistor.

6. The semiconductor package of claim 1, wherein each of the first and second pads has a substantially uniform thickness.

7. A semiconductor package, comprising: a lead frame including:
a first lead;
a first pad coupled to the first lead and comprising a first recessed portion and a first non-recessed portion;
a second lead; and
a second pad coupled to the second lead and comprising a second recessed portion and a second non-recessed portion, the first and second recessed portions separated by a first gap; and a heat-generating device coupled to the first and second non-recessed portions and exposed to a top surface of the semiconductor package.

8. The semiconductor package of claim 7, wherein the first non-recessed portion has a thickness that is approximately twice that of the first recessed portion.

9. The semiconductor package of claim 7, wherein the first and second pads are not exposed to the exterior of the semiconductor package.

10. The semiconductor package of claim 7, wherein the heat-generating device faces the first and second recessed portions.

11. The semiconductor package of claim 7, wherein the heat-generating device is a shunt resistor.

12. A method, comprising:
fabricating a lead frame including first and second leads, a first pad coupled to the first lead and a second pad coupled to the second lead, the first and second pads separated by a gap;
coupling a heat-generating device to the first and second pads; and
applying a mold compound to the lead frame and the heat-generating device to form a housing, wherein a surface of the heat-generating device is flush with a top surface of the housing.

13. The method of claim 12, further comprising coupling a heat sink to a surface of the heat-generating device exposed to the exterior of the housing.

14. The method of claim 12, further comprising coupling a surface of the heat-generating device exposed to the exterior of the housing to a metal trace on a printed circuit board (PCB).

15. The method of claim 12, wherein the first and second pads are not exposed to the exterior of the housing.

16. The method of claim 12, wherein each of the first and second pads includes a recessed portion, the recessed portions facing the heat-generating device.

* * * * *